(12) United States Patent
Lauk et al.

(10) Patent No.: US 8,292,109 B2
(45) Date of Patent: Oct. 23, 2012

(54) PRESSURE COMPENSATION ELEMENT, IN PARTICULAR FOR PRESSURE COMPENSATION IN A HOUSING

(75) Inventors: Detlef Lauk, Renchen (DE); Norbert Wegner, Buehl (DE); Gerald Maier, Ottersweier-Unzhurst (DE); Mario Huesges, Buehlertal (DE); Andreas Mueller, Herxheim (DE); Regina Neigel, Buehl (DE)

(73) Assignee: Robert Bosch GmbH, Stuttgart (DE)

( * ) Notice: Subject to any disclaimer, the term of this patent is extended or adjusted under 35 U.S.C. 154(b) by 634 days.

(21) Appl. No.: 12/304,616

(22) PCT Filed: Jul. 31, 2007

(86) PCT No.: PCT/EP2007/057890
§ 371 (c)(1),
(2), (4) Date: Dec. 12, 2008

(87) PCT Pub. No.: WO2008/037528
PCT Pub. Date: Apr. 3, 2008

(65) Prior Publication Data
US 2009/0266815 A1    Oct. 29, 2009

(30) Foreign Application Priority Data

Sep. 27, 2006  (DE) .......................... 10 2006 045 996
Dec. 29, 2006  (DE) .......................... 10 2006 062 044

(51) Int. Cl.
*B65D 90/36* (2006.01)
*B65D 51/16* (2006.01)
*B21D 39/03* (2006.01)
(52) U.S. Cl. ................ 220/89.1; 220/89.4; 220/203.01; 220/203.11; 220/203.16; 220/203.18; 220/367.1; 215/307; 29/428

(58) Field of Classification Search .................. 220/89.1, 220/89.4, 203.01, 203.11, 203.16, 203.18, 220/367.1; 215/307, 311; 29/428
See application file for complete search history.

(56) References Cited

U.S. PATENT DOCUMENTS

| 2,528,794 | A |   | 10/1950 | Andrews |         |
|-----------|---|---|---------|---------|---------|
| 3,845,878 | A |   | 11/1974 | Carlson |         |
| 3,908,684 | A |   | 9/1975  | Short   |         |
| 6,056,439 | A | * | 5/2000  | Graham  | 383/103 |
| 6,883,675 | B2| * | 4/2005  | Maenke  | 220/203.11 |
| 7,080,657 | B1| * | 7/2006  | Scott   | 137/15.18 |

FOREIGN PATENT DOCUMENTS

WO  PCT/US2005/042043   *   5/2006

* cited by examiner

*Primary Examiner* — Anthony Stashick
*Assistant Examiner* — Madison L Poos
(74) *Attorney, Agent, or Firm* — Michael Best & Friedrich LLP

(57) ABSTRACT

The invention relates to a pressure compensation device for compensating pressure between an inner chamber of a housing, in particular an electric motor, gearbox, container or the like and an outer side. The device includes a pressure compensation membrane mounted on an annular end face of a cylindrical structure that extends toward the outer side. The cylindrical structure is provided with a ventilation channel that extends therethrough. The cylindrical structure extends towards the outer side in order to form a projection from the wall of the housing, which projection is delimited by the end face on which the membrane is applied in a curved, dome-shaped form. A protective cover extends towards the outer side at a spaced apart distance in relation to the membrane over the cylindrical structure.

14 Claims, 5 Drawing Sheets

PRESSURE COMPENSATION ELEMENT, IN PARTICULAR FOR PRESSURE COMPENSATION IN A HOUSING

CROSS-REFERENCE TO RELATED APPLICATION

This application is a 35 USC 371 application of PCT/EP 2007/057890 filed on Jul. 31, 2007.

BACKGROUND OF THE INVENTION

1. Field of the Invention

The present invention relates to a pressure compensation element for compensating for pressure in an inner chamber of a housing, in particular of an electrical housing, motor housing, or gearbox, container, or the like. In particular, the invention relates to a pressure compensation element that protects the inner chamber of the housing against moisture and liquids from outside, and so forth, and furthermore offers improved protection against electrostatic discharge (ESD protection).

2. Description of the Prior Art

German Utility Model DE 295 11 683 U1 discloses a pressure compensation element in the form of a closure cap for containers, housings, bottles, or the like. The pressure compensation element is placed in the wall of the housing and has a pressure compensation diaphragm; the closure cap of at least similar shape has a cylindrical structure, since it includes a round channel in a cylinder. The opening through which the pressure compensation can take place therefore extends through the cylinder. A diaphragm is placed inside the cylinder, and the diaphragm is accommodated underneath the outer surface of the housing. If water should enter from the outside, it can accumulate on the top of the diaphragm, which over long-term use of the pressure compensation element can lead to failure of the diaphragm. Moreover, the manufacturing technique is limited to extrusion coating or injection of the diaphragm (cast-in technique), or else the diaphragm must be incorporated in a complicated way into the body of the closure cap. Although both plane and curved versions of the diaphragm are disclosed, nevertheless the curved version corresponds to the contour of only the closure cap, and thus the curved diaphragm is not equivalent to a free curvature inside the cylindrical structure. From a manufacturing standpoint, the closure cap with the pressure compensation element proves to be very complicated; a further factor is that the closure cap is not completely protected against mechanical factors from the outside of the housing by a cap. If the diaphragm is damaged, liquids can both get into the housing and escape from the housing.

From German Patent DE 196 26 792 C1, a pressure compensation element in the form of a closure element embodied as a plastic injection-molded part is disclosed. It serves the purpose of sealed, detachable closure of a complementary opening embodied in a housing, container, or the like. A filter medium, as an interface between the spaces inside and outside the housing, is integrated with the closure element; the filter medium is injected into or integrally injection molded onto the bearer part comprising at least a first thermoplastic component, and the bearer part is extrusion-coated with at least a second thermoplastic component, which in its consistency is different from the first component, to form a resultant shaped body of the closure element.

Although the technique of extrusion coating of a shaped body using an injection molding material offers effective reception of the diaphragm, nevertheless, the technique of plastic extrusion coating requires at least one indentation inside which the diaphragm is placed, and the indentation forms the opening through which the pressure compensation can take place. This embodiment also has the disadvantage that a cavity, in the form of an indentation above the diaphragm, develops that can fill with liquid and put the diaphragm out of operation. Moreover, there is no possibility of introducing the diaphragm into the receptacle in a cued form. Moreover, there is no possibility of protecting the diaphragm, by means of a cap, closure, or the like, against mechanical influences from the direction of the outer side.

Moreover, pressure compensation elements are also known which have diaphragms that are welded or clamped onto a bearer structure. The welding can be done by means of a laser-beam welding process or an ultrasonic welding process. In that process, the diaphragm is mounted on the outside of the receiving structure, but this structure is neither protected against moisture, liquids, and the like, from the outside nor offers protection against mechanical influences. Damage to the diaphragm from liquid or a mechanical influence therefore often causes the failure of the pressure compensation element.

OBJECT AND SUMMARY OF THE INVENTION

It is therefore the object of the present invention to create a pressure compensation element for compensating for pressure in a housing that overcomes the disadvantages of the aforementioned prior art and offers effective protection against both liquids and mechanical influences.

The invention includes the technical teaching that the cylindrical structure extends in the direction of the outside, in order to form a projection from the wall of the housing, and this projection is defined by an annular end face on which the diaphragm, in a curved, dome-shaped form, is mounted, and the pressure compensation element moreover includes a protective cap, which extends above the cylindrical structure, spaced apart from the diaphragm in the direction of the outside.

The cylindrical structure, in its embodiment, offers the advantage that liquids which can flow over the outside of the wall or at least wet it will not reach the diaphragm. The reason is the raised position of the diaphragm as installed; it is mounted on the end of the cylindrical structure, and the cylindrical structure extends at least so far out of the wall in the direction of the outside that liquids cannot directly reach the diaphragm. Because of the thus-improved water drainage, it is attained that the water flowing or standing on the outside of the wall flows around the cylindrical structure and cannot get above the diaphragm. Only large amounts of water can reach the diaphragm, but in the normal use of the pressure compensation element that occurs only rarely. Geometries or spacings of the surfaces of the parts exceed 4 mm, for instance, and prevent the surface tension or contact angle of the water, from adhering. Thus even liquids that have only a slight contact angle and therefore exhibit increased interaction with the wall are kept from reaching the diaphragm and wetting it. Wetting of the diaphragm by a liquid getting in from the outside can clog the pores of the diaphragm and make it impermeable. That puts the diaphragm out of operation, and because of the resultant overpressure or underpressure inside the housing, the diaphragm can tear. By the disposition of the diaphragm according to the invention, wetting of the diaphragm with a liquid is reduced at least in terms of its risk, so that the service life of the diaphragm is lengthened.

The protective cap of the invention extends above the diaphragm, and there is a certain spacing (for instance, 4 mm) between the diaphragm and the protective cap, to prevent capillary action of the water, so that at the same time, an accumulation of water between the diaphragm and the protective cap is avoided. In particular, the curved, dome-shaped form of the diaphragm has the effect that the accumulation of water above the diaphragm or between the diaphragm and the protective cap is avoided and cannot dry out there and leave residues from drying out.

The diaphragm initially has a plane structure in its outer region, and the curvature extends only above the diameter of the cylindrical structure. Thus the diaphragm can be mounted in the plane outer side, on the annular end face of the cylindrical structure.

An advantageous refinement of the invention provides that the diaphragm is mounted on the end face by means of an ultrasonic welding process. The protective cap can also be mounted on the body of the pressure compensation element by means of an ultrasonic welding process. Ultrasonic welding is an especially suitable method for joining two components, made from a plastic, to one another in pressure-tight fashion. The thermal and mechanical stress on the components is minimal, and the importation of heat is limited to the joining point only, so that the diaphragm, affected in its structure, can be welded to the end side of the cylindrical structure. The mounting of the protective cap can also advantageously be done by a laser-beam welding process.

A further advantage of the pressure compensation element of the invention is that the protective cap has a hoodlike basic structure with a circumferentially partly interrupted jacket portion, so that the jacket portion is embodied in the form of riblike integrally molded features. The hoodlike basic structure comprises a circular-disklike cap part, in which in the peripheral area, fingerlike jacket portions extend approximately 90° to the plane of the cap region, so that the jacket region of the hoodlike protective cap has corresponding partial interruptions. For instance, four, eight, and preferably six fingerlike jacket portions can be provided, between which corresponding openings are formed. Through the openings, the pressure compensation between the inner chamber and the outside of the housing can be accomplished while the cap is mounted on the body of the pressure compensation element. The welded connection of the cap to the body of the pressure compensation element is made via the end of the fingerlike integrally molded features on the basic structure of the protective cap. The protective cap can likewise be made as a plastic component, and once again its production is based on a plastic injection molding process.

Advantageously, the protective cap has a plane-dislike basic structure, on which on the plane side, riblike integrally molded features are integrally formed that have a curvature embodied in the radial direction of the plane-dislike basic structure and are disposed, uniformly distributed, on the basic structure in the circumferential direction thereof. As a result, a turbine-wheel-like geometry of the protective cap is created, with the many integrally molded features, and the turbine-wheel-like geometry prevents a linear passageway from being created radially from the outside of the protective cap into the inside of the protective cap. Only a curved communication is possible because of the crescent-shaped integrally molded features, which increases the security against electrostatic discharges from the outside into the inner chamber. As long communication between the inner chamber and the outside is made possible only via curved courses, increased security against a disruptive electrostatic discharge is assured. The turbine-wheel-like, crescent-shaped integrally molded features can be disposed so close together that the outside of an adjacent rib overlaps the inside of a further rib, at least over a relatively large proportion of it. Thus the possibility of a gas and liquid exchange does exist, but it is not possible to form a direct communication between the inside and the outside in the form of a straight line.

Advantageously, for bracing the diaphragm, a supporting structure is embodied inside the cylindrical structure. The supporting structure may be embodied in one piece with the cylindrical structure and may be in the form of a supporting cross. The interstices formed by the supporting cross form the ventilation channel, so that in the case of a crosslike structure, four individual ventilation channels are formed. On the outside, the supporting structure has a curvature that corresponds to the curvature of the diaphragm. If the diaphragm is subjected to an underpressure or overpressure, then at least in one direction the diaphragm can rest on the supporting cross, so that the mechanical stress on the diaphragm can be kept slight.

A further advantageous embodiment of the invention provides that inside the cylindrical structure, the ventilation channel extends through the supporting structure in labyrinthine form, thus preventing a linear embodiment of the ventilation channel. As already mentioned in connection with the turbine-wheel-like structure of the protective cap, the ventilation channel inside the cylindrical structure can also have angles and curves, so that a linear ventilation channel is prevented. Potential electrostatic discharges cannot reach the inside from outside through the pressure compensation element, because of the curved course of the ventilation channel. Vulnerable electronics, such as an engine control unit, electrostatically vulnerable electronic components, and so forth, can be disposed on the inside.

For production reasons, it is especially advantageous that the body of the pressure compensation element, formed of at least the cylindrical structure and the supporting structure, is produced by a plastic injection molding process and is inserted into the wall of the housing and sealingly joined to it or is embodied in one piece with it and made of the same material. If the wall of the housing itself is made by an injection molding process, then the possibility can be exploited of producing the pressure compensation element in a unified way, as a single injection-molded component together with the wall of the housing. The labyrinthine structure, the supporting cross, and the cylindrical structure itself can be embodied such that no additional slides inside the injection molding tool are necessary. An injection molding tool with only a single parting plane can suffice, whenever no undercuts are provided in the direction in which the cylindrical structure extends. If for structural reasons it is advantageous to embody the pressure compensation element as a single part, then it can likewise be inserted into the wall of the housing by an ultrasonic welding process and joined to the wall in pressure-tight fashion. Another possible way of joining the parts is laser-beam welding, adhesive bonding, screwing, or compacting.

The present invention further relates to a method for producing the pressure compensation element of the invention, in which the diaphragm is welded onto the end face of the cylindrical structure by means of a sonotrode by the process of an ultrasonic welding process, and the sonotrode includes a curved, dome-shaped receiving structure, in which the diaphragm is received to create the curved, dome-shaped structure. Advantageously, the receiving structure is curved inward in the sonotrode and has an underpressure connection, in which an underpressure is generated, and by means of the underpressure, the diaphragm is drawn into the inward-curved, dome-shaped receiving structure during the ultrasonic welding process. On the principle of a suction cup, the diaphragm can be drawn by suction into the receiving structure so that the latter presses against the inward-curved structure in the sonotrode. By copying the inward-curved receiving structure in the diaphragm, the diaphragm is welded in the curved state onto the end face of the cylindrical structure, so that it maintains its curved structure after the welding.

BRIEF DESCRIPTION OF THE DRAWINGS

Further provisions that improve the invention will be described below in further detail, along with the description of a preferred exemplary embodiment of the invention, in conjunction with the drawings, in which.

DESCRIPTION OF THE PREFERRED EMBODIMENTS

Figure 1:
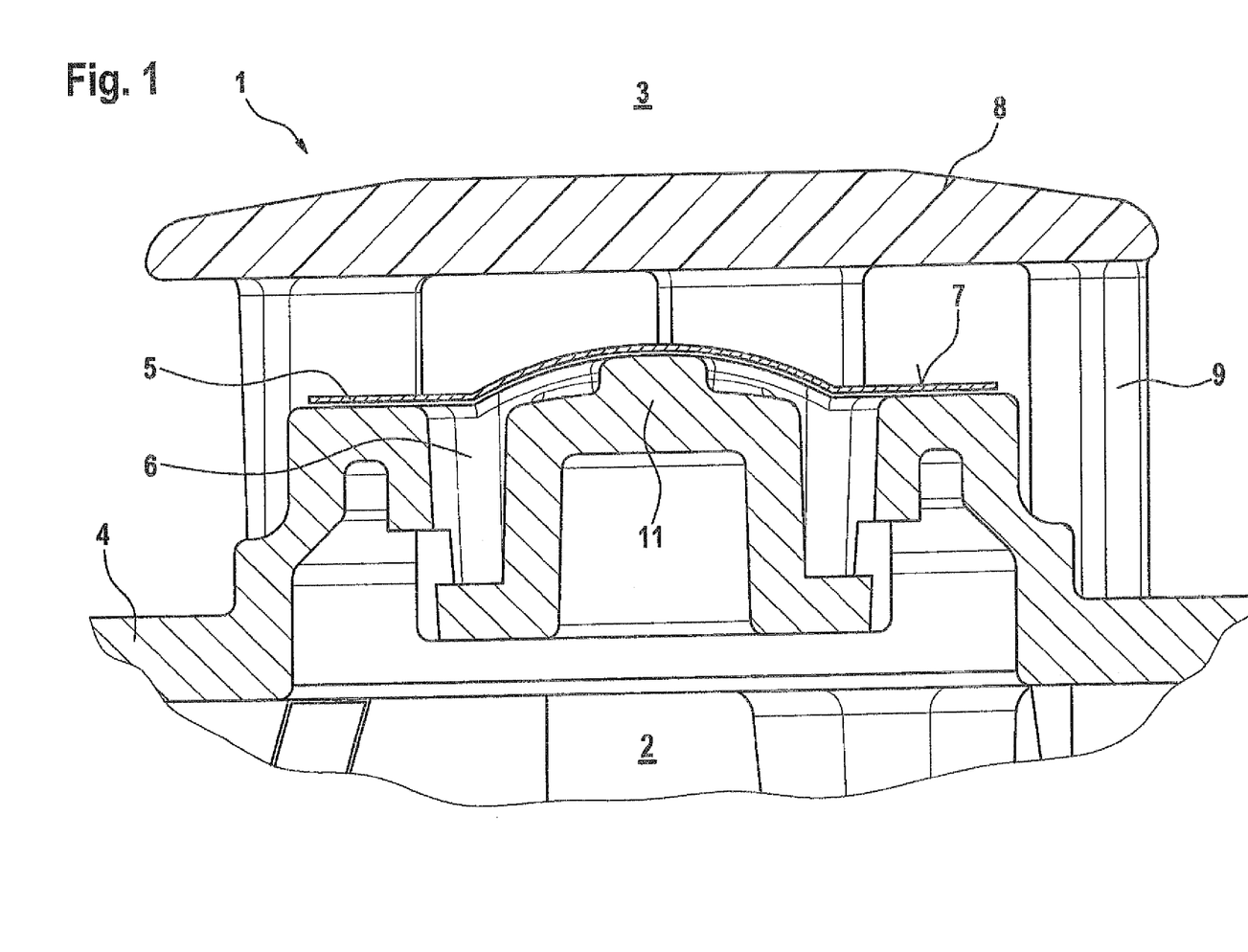
FIG. 1, a cross-sectional side view of the pressure compensation element, with a protective cap placed on it.

The pressure compensation element shown in cross section in FIG. 1 is identified by reference numeral 1. The pressure compensation element 1 is placed inside the wall 4 of a housing, in particular an electrical housing, motor housing, or gearbox, container, or the like. In the view shown, the pressure compensation element 1 is in one piece and is embodied of the same material as the wall 4. This illustration is purely an example, so that the pressure compensation element 1 may also be placed as an individual part into the wall 4.

The pressure compensation element 1 serves to compensate for pressure between an inner chamber 2 and an outer side 3. Between the inner chamber 2 and the outer side 3, there is a diaphragm 5, and the diaphragm 5 is mounted on the end face of a cylindrical structure that extends in the direction of the outer side 3. Because of the cylindrical structure, the joining point or reception point of the diaphragm 5 rises out of the plane of the wall 4. Thus liquids that run along the outer side 3 over the wall 4, or that are applied to it or wet it, are unable to reach the diaphragm 5. Moreover, the diaphragm 5 has a curvature oriented in the direction of the outer side 3, so that the diaphragm 5 is embodied in the form of a dome or spherical cap, and as a result, liquids immediately flow off it. Only in the region of the joining place between the diaphragm 5 and the end face 7 of the cylindrical structure does the diaphragm 5 have an annular plane surface, in order to offer a certain joining surface for a joining process, in particular for an ultrasonic welding process.

Between the inner chamber 2 and the outer side 3, multiple ventilation channels 6 extend through the cylindrical structure. The multiple ventilation channels 6 may be interrupted or separated from one another by the supporting structure.

The supporting structure likewise has a curved, dome-shaped upper side, against which the diaphragm 5 can press. Thus the diaphragm can be protected against overexpansions that can occur when the pressure difference between the inner chamber 2 and the outer side 3 exceeds a limit value.

From the outer side 3, a protective cap 8 is placed on the pressure compensation element 1. The protective cap 8 can be welded, glued, clamped, or in some other way attached to the wall 4 or circumferentially to the pressure compensation element 1 in the region of the cylindrical structure and is at the same time centered by the cylindrical structure. The protective cap 8 includes a protective function, so that the diaphragm 5 is protected against mechanical influences from the direction of the outer side 3. The protective cap 8 furthermore has riblike integrally molded features, which are formed by window-shaped interruptions. The pressure compensation can take place through the window-shaped interruptions, so that a certain ventilation takes place between the inside of the protective cap 8, in which the diaphragm 5 is located, and the outer side 3.

Figure 2:
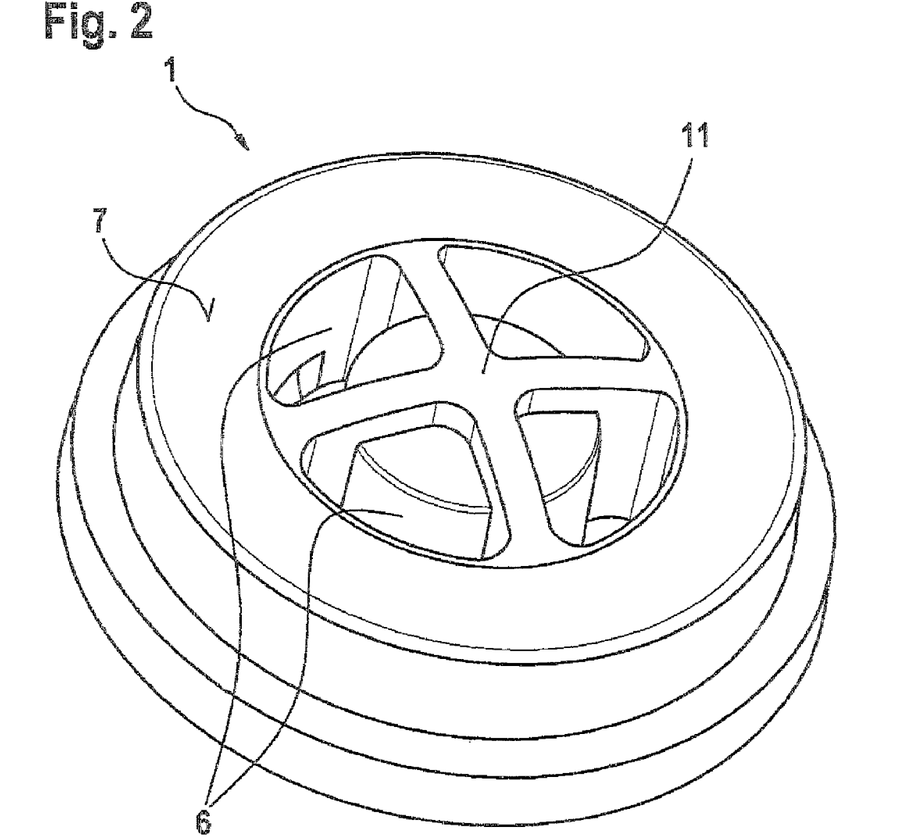
FIG. 2, the pressure compensation element in the region of the cylindrical structure, with a supporting structure disposed on it.

FIG. 2 shows the geometrical embodiment of the supporting structure 1I inside the cylindrical structure, which is defined by the end face 7. In this view, the diaphragm is not shown, in order to show the precise embodiment of the supporting structure 11. The supporting structure 11 is embodied in the form of a supporting cross and can be made in one piece with the cylindrical structure. The interstices between the cross-like laminations of the supporting structure 11 form the ventilation channels 6, which have a certain curvature in order to avoid a linear communication from the outer side into the inside. This increases the security against electrostatic discharges, which can therefore not reach the inner chamber.

Figure 3A:
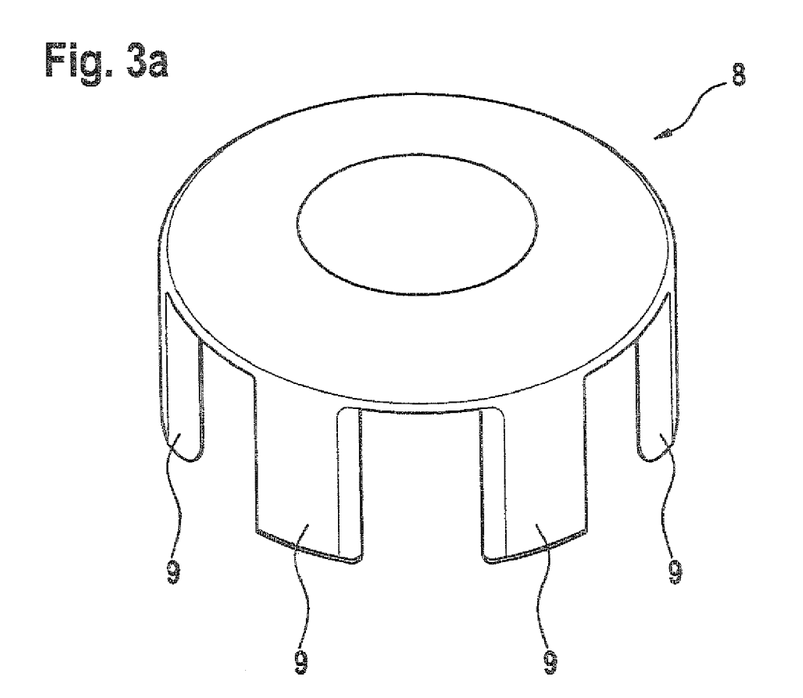
FIG. 3a, a view of a first exemplary embodiment of the protective cap, in a first view.
Figure 3B:
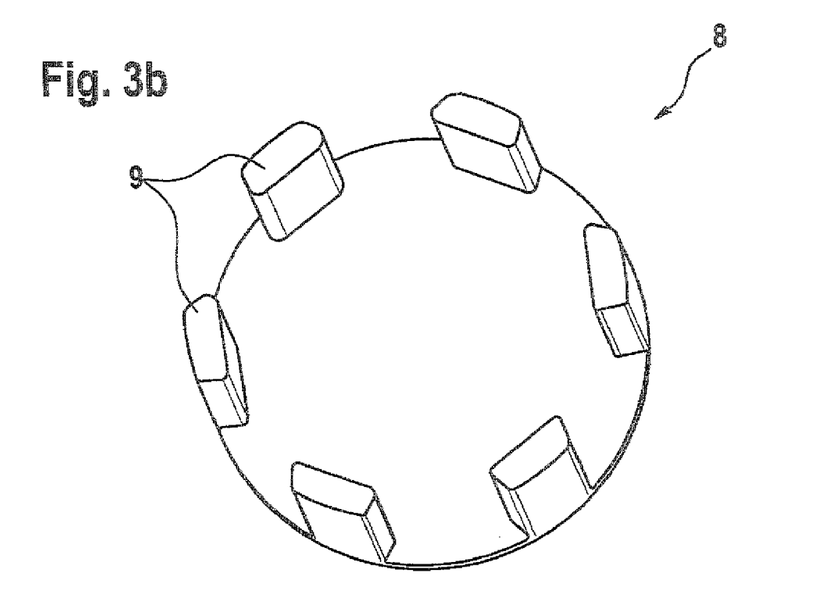
FIG. 3b, the version of the protective cap of FIG. 3a, in a further view.

FIGS. 3a and 3b show a perspective view of a first exemplary embodiment of the protective cap 8. The protective cap 8 has a plane-dislike basic structure, on which a plurality of riblike integrally molded features 9 are embodied. The protective cap 8 can be produced as a plastic injection-molded component, so that the riblike integrally molded features are made in one piece with the basic structure of the protective cap 8. Between the riblike integrally molded features, there are free spaces, to assure the pressure compensation by the pressure compensation element despite the protective cap 8 joined to it.

Figure 4A:
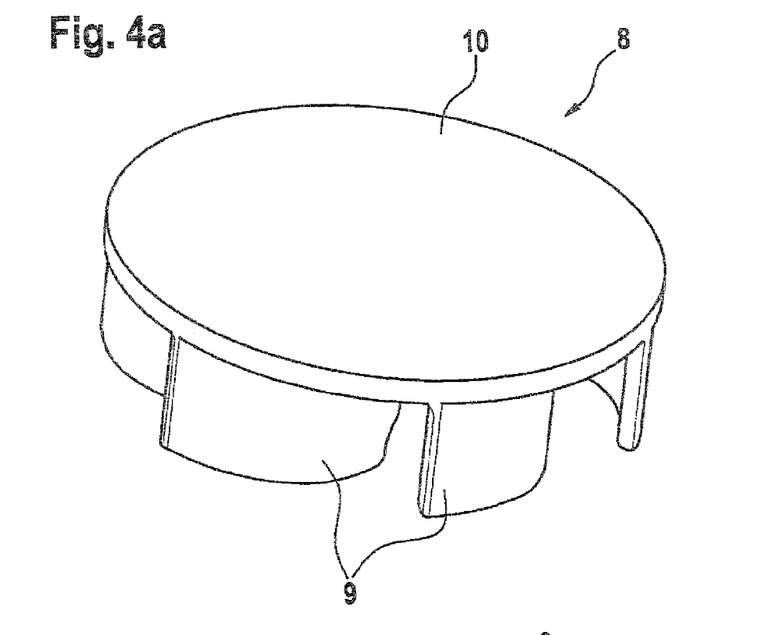
FIG. 4a, a further embodiment of the protective cap, in a first view.
Figure 4B:
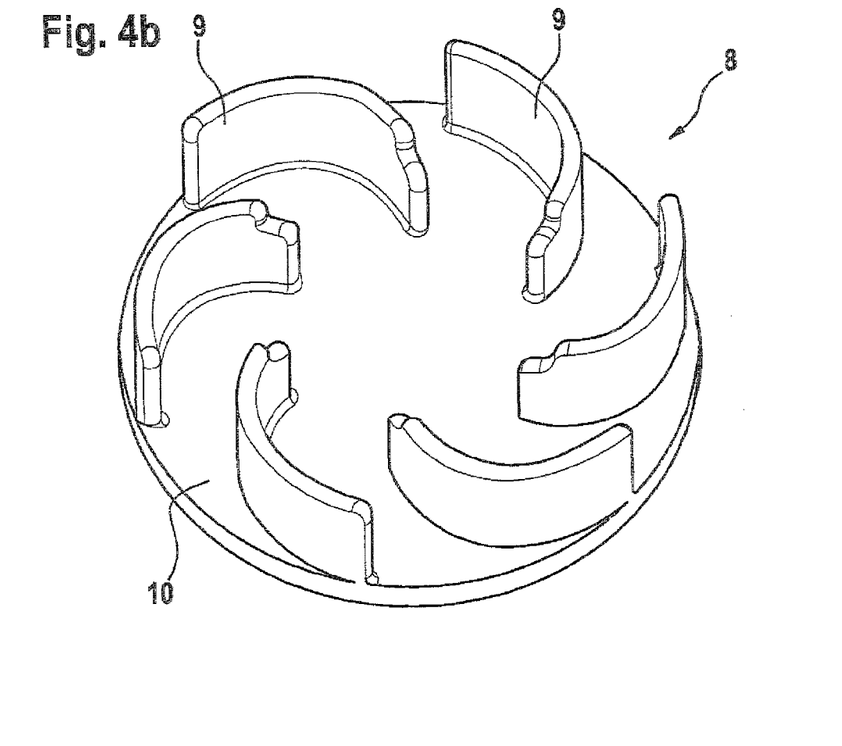
FIG. 4b, the second embodiment of the protective cap, in a further view.

FIGS. 4a and 4b show a further exemplary embodiment of the protective cap 8, which besides the plane-dislike basic structure 10, on its inner side, has turbine-wheel-like integrally molded features that are identified as riblike integrally molded features 9. The riblike integrally molded features, curved as turbine wheel blades, prevent a linear communication between the outside and the inside in the radial direction of the protective cap 8. The riblike integrally molded features overlap, so that a direct communication from the outside to the inside is possible only via a curved communication.

Figure 5:
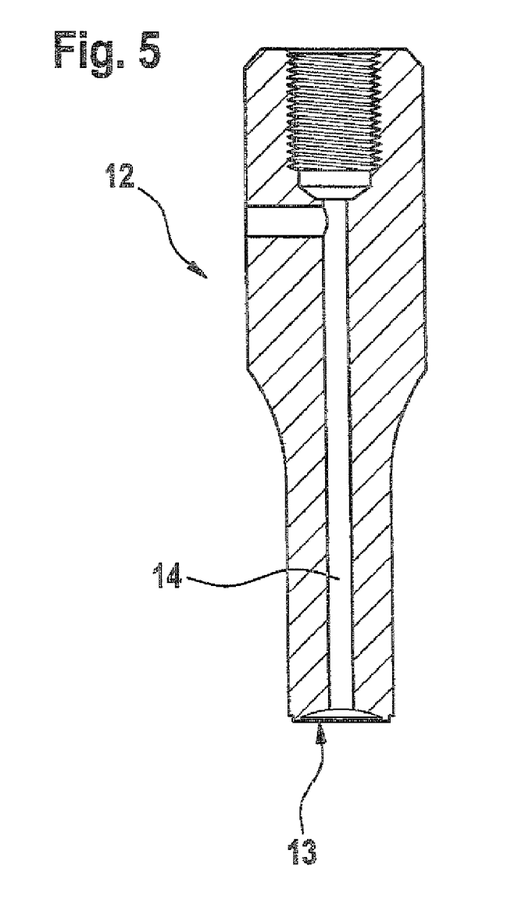
FIG. 5, a simplified illustration of a sonotrode for ultrasonic welding of the diaphragm of the pressure compensation element to a receiving structure according to the invention.

FIG. 5 shows a sonotrode 12, which is employed in the method for producing the pressure compensation element of the invention. The sonotrode 12 serves as an active tool for performing an ultrasonic welding process and is set to vibrating ultrasonically, in order to generate heat in the joining plane between the diaphragm—shown in the drawing—and the joining partner—also not shown—which heat melts the materials and thus joins them together. In particular, the sonotrode serves to weld the diaphragm ultrasonically to the end face of the cylindrical structure of the pressure compensation element.

The sonotrode 12 has a receiving structure 13, which includes an inward—curved, dome-shaped structure. The sonotrode 12 furthermore has an underpressure connection 14, which discharges centrally into the receiving structure 13. If an underpressure is applied to the underpressure connection 14, the diaphragm is drawn by suction into the contour of the receiving structure 13, thus creating the dome-shaped form of the diaphragm. The method for joining the diaphragm to the end face provides that the underpressure is maintained during the ultrasonic welding process, in order to weld the diaphragm in its curved form onto the end face. Thus after the welding operation, the diaphragm remains in the curved form, in order to implement the disposition according to the invention of the diaphragm.

Figure 6:
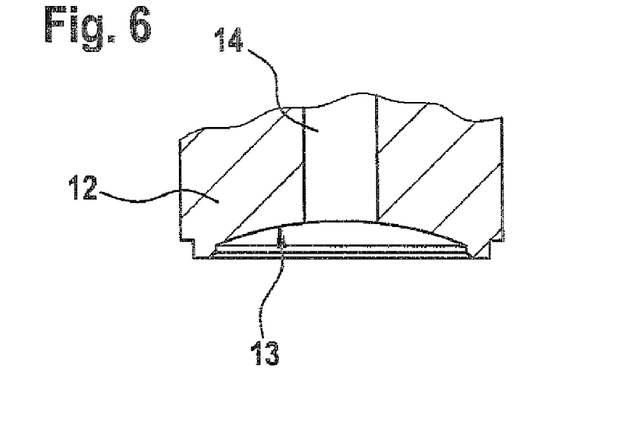
FIG. 6, an enlarged view of the receiving structure in the sonotrode, into which the diaphragm is placed for the ultrasonic welding.

FIG. 6 shows an enlarged view of the receiving structure 13 of the sonotrode 12, into which the underpressure connection 14 discharges. If the sonotrode 12 is placed on the initially plane-disklike diaphragm, then when an underpressure is applied in the underpressure connection 14, an underpressure is likewise generated inside the receiving structure 13. The diaphragm is thus pulled into the receiving structure and presses against the curved wall. Thus not only is the diaphragm brought into the desired state of curvature, but it can also be handled by the sonotrode in the manner of a suction cup.

The foregoing relates to the preferred exemplary embodiment of the invention, it being understood that other variants and embodiments thereof are possible within the spirit and scope of the invention, the latter being defined by the appended claims.

The invention claimed is:

1. A pressure compensation element for compensating for pressure in an inner chamber of a housing relative to an outer side, which element is placed into a wall of the housing, the element comprising:
   a pressure compensation diaphragm;
   a cylindrical structure with a ventilation channel extending through it from the inner chamber to the outer side in order to form a projection from the wall of the housing, the projection being defined by an annular end face on which the diaphragm is mounted in a curved, dome-shaped form; and
   a protective cap which is mounted to the wall and extends above the cylindrical structure and is spaced apart from the diaphragm in the direction of the outer side, wherein the protective cap has a plane-dishlike basic structure, on which on a planar side thereof, riblike integrally molded helically curved fingers are integrally formed, the fingers being disposed, uniformly distributed, on the basic structure in a circumferential direction thereof.

2. The pressure compensation element as defined by claim 1, wherein the diaphragm is mounted on the end face by means of an ultrasonic welding process.

3. The pressure compensation element as defined by claim 1, wherein the protective cap is mounted on a body of the pressure compensation element by means of an ultrasonic welding process.

4. The pressure compensation element as defined by claim 2, wherein the protective cap is mounted on a body of the pressure compensation element by means of an ultrasonic welding process.

5. The pressure compensation element as defined by claim 1, wherein a supporting structure for bracing the diaphragm is placed inside the cylindrical structure.

6. The pressure compensation element as defined by claim 5, wherein a body of the pressure compensation element, formed of at least the cylindrical structure and the supporting structure, is produced by means of a plastic injection molding process, the body being inserted into the wall of the housing and sealingly joined to it or the body being embodied in one piece with the wall and made of the same material.

7. A pressure compensation element for compensating for pressure in an inner chamber of a housing relative to an outer side, which element is placed into a wall of the housing, the element comprising:
   a pressure compensation diaphragm;
   a cylindrical structure with a ventilation channel extending through it from the inner chamber to the outer side in order to form a projection from the wall of the housing, the projection being defined by an annular end face on which the diaphragm is mounted in a curved, dome-shaped form; and
   a protective cap which is mounted to the wall and extends above the cylindrical structure, spaced apart from the diaphragm in the direction of the outer side, wherein a supporting structure for bracing the diaphragm is placed inside the cylindrical structure, wherein inside the cylindrical structure, the ventilation channel extends through the supporting structure in labyrinthine form, thus preventing a linear embodiment of the ventilation channel.

8. The pressure compensation element as defined by claim 7, wherein the protective cap has a hoodlike basic structure, with a circumferentially partially interrupted jacket portion, so that the jacket portion is embodied in the form of riblike integrally molded fingers.

9. The pressure compensation element as defined by claim 7, wherein the protective cap has a plane-dishlike basic structure, on which on a planar side thereof, riblike integrally molded curved fingers are integrally formed, the fingers being disposed, uniformly distributed, on the basic structure in a circumferential direction thereof.

10. The pressure compensation element as defined by claim 8, wherein a supporting structure for bracing the diaphragm is placed inside the cylindrical structure.

11. The pressure compensation element as defined by claim 9, wherein a supporting structure for bracing the diaphragm is placed inside the cylindrical structure.

12. The pressure compensation element as defined by claim 10, wherein a body of the pressure compensation element, formed of at least the cylindrical structure and the supporting structure, is produced by means of a plastic injection molding process, the body being inserted into the wall of the housing and sealingly joined to it or the body being embodied in one piece with the wall and made of the same material.

13. A method for producing a pressure compensation element, which compensates for pressure in an inner chamber of a housing relative to an outer side, which pressure compensation element is placed into a wall of the housing, the pressure compensation element comprising:
   a pressure compensation diaphragm;
   a cylindrical structure with a ventilation channel extending through it towards the outer side in order to form a projection from the wall of the housing, the projection being defined by an annular end face on which the diaphragm is mounted in a curved, dome-shaped form; and
   a protective cap which is mounted to the wall and extends above the cylindrical structure and is spaced apart from the diaphragm in the direction of the outer side, the method for producing the pressure compensation element comprising the steps of:
   welding the diaphragm onto the end face of the cylindrical structure by means of a sonotrode by the process of an ultrasonic welding process, the sonotrode including a curved, dome-shaped receiving structure, and receiving the diaphragm in the receiving structure thereby creating a curved, dome-shaped structure of the diaphragm.

14. The method as defined by claim 13, wherein the receiving structure is curved inward in the sonotrode, the sonotrode has an underpressure connection, and the method further includes the step of:

generating an underpressure by means of the underpressure connection and applying the underpressure to the diaphragm, thereby drawing the diaphragm into the inward-curved, dome-shaped receiving structure during the ultrasonic welding process.

* * * * *